United States Patent
Zhou et al.

(10) Patent No.: US 10,705,169 B2
(45) Date of Patent: Jul. 7, 2020

(54) DEVICE HAVING INERT GAS NUCLEUS CHANNEL AND METHOD FOR MAGNETIC RESONANCE IMAGING USING THE SAME

(71) Applicant: Wuhan Institute of Physics And Mathematics, Chinese Academy of Sciences, Wuhan, Hubei (CN)

(72) Inventors: Xin Zhou, Hubei (CN); Yeqing Han, Hubei (CN); Xianping Sun, Hubei (CN); Lei Shi, Hubei (CN); Maili Liu, Hubei (CN); Chaohui Ye, Hubei (CN)

(73) Assignee: Wuhan Institute of Physics And Mathematics, Chinese Academy of Sciences, Wuhan (CN)

( * ) Notice: Subject to any disclaimer, the term of this patent is extended or adjusted under 35 U.S.C. 154(b) by 163 days.

(21) Appl. No.: 16/058,989

(22) Filed: Aug. 8, 2018

(65) Prior Publication Data
US 2018/0372823 A1    Dec. 27, 2018

Related U.S. Application Data

(63) Continuation of application No. PCT/CN2016/094041, filed on Aug. 8, 2016.

(30) Foreign Application Priority Data

Feb. 22, 2016   (CN) .......................... 2016 1 0094660

(51) Int. Cl.
*G01R 33/54* (2006.01)
*G01R 33/56* (2006.01)
(Continued)

(52) U.S. Cl.
CPC ......... *G01R 33/543* (2013.01); *G01R 33/282* (2013.01); *G01R 33/36* (2013.01);
(Continued)

(58) Field of Classification Search
CPC .. G01R 33/543; G01R 33/5601; G01R 33/36; G01R 33/3635; G01R 33/3607;
(Continued)

(56) References Cited

U.S. PATENT DOCUMENTS

| 4,689,563 A | * | 8/1987 | Bottomley | ......... G01R 33/3607 324/309 |
| 4,694,254 A | * | 9/1987 | Vatis | .................. G01R 33/3607 324/309 |

(Continued)

FOREIGN PATENT DOCUMENTS

| CN | 103697801 A | 4/2014 |
| JP | H04141146 A | 5/1992 |
| JP | H06197885 A | 7/1994 |

OTHER PUBLICATIONS

Sun, Xianping et al., "Hyperpolarized 129Xe magnetic resonance imaging and its applications in biomedicine," Physics, vol. 40, No. 6, pp. 381-390, ISSN: 0379-4148 (Jun. 30, 2011).

*Primary Examiner* — Dixomara Vargas
(74) *Attorney, Agent, or Firm* — Mei & Mark LLP; Manni Li

(57) ABSTRACT

An inert gas nucleus channel device comprising a magnetic resonance control system, a radio frequency generator, an RF amplifier and AD converter, a frequency synthesizer, a first mixer, a second power amplifier, a second T/R switch, an inert gas nucleus coil, a second pre-amplifier and a second mixer. A magnetic resonance imaging method is also disclosed. The method controls an increase or decrease in a frequency of a pulse or echo signal excited by a radio-frequency signal, implementing magnetic resonance imaging using hyperpolarized inert gases (such as xenon, helium, and krypton), making it possible to apply MRI to lungs and brains using the hyperpolarized inert gases, and expanding the probing range of MRI. The inert gas nucleus channel (Continued)

device is simple in structure and easy to operate and upgrades a hydrogen nucleus magnetic resonance imaging instrument to become a multi-nuclei MRI system using the hyperpolarized inert gases.

5 Claims, 2 Drawing Sheets

(51) Int. Cl.
    *G01R 33/36*     (2006.01)
    *G01R 33/28*     (2006.01)
    *G01R 33/385*     (2006.01)

(52) U.S. Cl.
    CPC ....... *G01R 33/365* (2013.01); *G01R 33/3607* (2013.01); *G01R 33/3614* (2013.01); *G01R 33/3621* (2013.01); *G01R 33/3635* (2013.01); *G01R 33/3852* (2013.01); *G01R 33/5601* (2013.01)

(58) Field of Classification Search
    CPC .............. G01R 33/282; G01R 33/3614; G01R 33/3621; G01R 33/365; G01R 33/3852
    See application file for complete search history.

(56) References Cited

U.S. PATENT DOCUMENTS

| | | | | |
|---|---|---|---|---|
| 5,433,196 | A * | 7/1995 | Fiat | G01R 33/5601 600/410 |
| 5,596,303 | A * | 1/1997 | Akgun | G01R 33/3875 335/216 |
| 5,682,883 | A * | 11/1997 | Fiat | G01R 33/5601 600/323 |
| 8,698,493 | B2 * | 4/2014 | Walker | G01R 33/26 324/307 |
| 2006/0280689 | A1 * | 12/2006 | Xiang | A61K 41/0052 424/9.34 |
| 2008/0265890 | A1 | 10/2008 | Graesslin et al. | |
| 2014/0163355 | A1 | 6/2014 | Kurpad et al. | |
| 2014/0361775 | A1 | 12/2014 | Qiu et al. | |
| 2015/0276899 | A1 | 10/2015 | Dai et al. | |

\* cited by examiner

DEVICE HAVING INERT GAS NUCLEUS CHANNEL AND METHOD FOR MAGNETIC RESONANCE IMAGING USING THE SAME

CROSS-REFERENCE TO RELATED APPLICATIONS

The subject application is a continuation of PCT/CN2016/094041 filed on Aug. 8, 2016, which claims priority on Chinese application no. 201610094660.X filed on Feb. 22, 2016. The contents and subject matters of both PCT application and Chinese priority application are incorporated herein by reference.

BACKGROUND OF THE INVENTION

Technical Field

The present invention relates to hyperpolarized inert gas-based magnetic resonance imaging and spectra, in particular, an inert gas nucleus channel device, which realizes specific radio-frequency pulse transmission of inert gas nuclei and radio-frequency signal reception through mixing. The present invention further provides a magnetic resonance imaging method, which is applicable to hyperpolarized inert gas (such as xenon, helium, and krypton)-based magnetic resonance imaging and spectra.

Description of Related Art

As a nonradioactive and noninvasive imaging technology, traditional magnetic resonance imaging (MRI) is based on hydrogen nuclei (protons) in human bodies and can realize structural and functional imaging of most tissue and organs of the human bodies, thereby having many incomparable advantages in medical diagnosis and study and playing a significant role in human health and public hygiene. However, by the fact that the lungs' cavity structure is mainly formed by pulmonary alveoli, the hydrogen nucleus density in the lungs is 1000 times lower than that of normal tissue, and thus, hydrogen nucleus magnetic resonance signals in the lungs are extremely weak, resulting in a limited capacity to diagnose pulmonary diseases of existing universal hydrogen nucleus magnetic resonance imaging systems. For this reason, the lungs have always been a dead zone of traditional magnetic resonance imaging. Nowadays, traditional hydrogen nucleus magnetic resonance imaging methods are used in hospitals to apply magnetic resonance imaging to the lungs, but the lungs are reflected only in the form of a "black hole," and no valuable structural or functional information can be obtained.

Inert gases with nuclei highly spin-polarized, such as laser-polarized xenon-129, helium-3 and krypton-83, can be generated through the laser pump and spin-exchange technique. As the strength (S) of nuclear magnetic resonance signals is in positive correlation with the degree of polarization ($P_0$) of nuclei, the strength of the magnetic resonance signals of inert gases can be improved by over 10,000 times (which is generally called hyperpolarization) through the laser pump and spin-exchange technique. Hyperpolarized inert gas-based magnetic resonance imaging of the lungs can be realized by using hyperpolarized inert gas nucleus magnetic resonance signals, generated by hyperpolarized inert gases inhaled into the lungs, as a new signal source. Particularly, the hyperpolarized inert gas xenon-129 can be dissolved in blood and fat and thus can further realize visualization of the brain function, having the potential to become a new tool for diagnosing early diseases of lungs and brains.

Imaging nuclei used for hyperpolarized inert gas-based magnetic resonance imaging are nuclei of inert gases such as xenon-129, helium-3 and krypton-83 instead of traditional hydrogen nuclei. Due to the fact that the hydrogen nuclei and the inert gas nuclei have different gyromagnetic ratios, the Larmor frequencies (namely the precession frequencies) are also different under specific field intensity $B_0$. For instance, the magnetic resonance frequency of the hydrogen nuclei is 3.6 times higher than that of the nuclei of the inert gas xenon-129. Radio-frequency pulse excitation of the nuclei of the inert gas xenon-129 and reception of magnetic resonance signals of the inert gas xenon-129 cannot be achieved through the hydrogen nucleus channel of a universal magnetic resonance imaging instrument. For this reason, it is necessary to add a new inert gas xenon-129 nucleus imaging channel to the universal magnetic resonance imaging instrument to realize radio-frequency pulse excitation of inert gas nuclei and to receive and process inert gas xenon-129 nucleus magnetic resonance imaging echo signals, thus, obtaining structural and functional information of the lungs filled with the hyperpolarized inert gas xenon-129 or probing brain functional information by delivering blood containing the hyperpolarized inert gas xenon-129 to the brain.

The existing heteronucleus magnetic resonance spectrum imaging technique is developed from the magnetic resonance imaging technique, can detect the physical and chemical environments of heterogeneous nuclei (such as $^{31}P$), and can be used for biochemical analysis of living bodies. The lung magnetic resonance imaging technique based on $^{19}F$ is put forward by the Duke University in 2011. A radio-frequency system of the hydrogen nucleus magnetic resonance imaging device is composed of a transmission chain, a radio-frequency coil and a reception chain. The transmission chain comprises a pulse envelope generator, a frequency synthesizer, a modulator and a radio-frequency power amplifier. The reception chain comprises a radio-frequency amplifier, a demodulator and an AD converter. These modules are mostly characterized by a narrow band frequency. The radio-frequency units of the universal magnetic resonance imaging system only operate at the hydrogen nucleus resonance frequency, and a conventional dual-frequency system which can detect heterogeneous nuclei needs to be integrally provided with two sets of frequency synthesizers, modulators, radio-frequency power amplifiers, coils, reception amplifiers, demodulators and AD converters, which respectively operate at resonance frequencies of different nuclei. Usually, based on hydrogen nucleus magnetic resonance imaging, primary data of heteronucleus magnetic resonance spectrum imaging has one additional time dimension, and thus, the speed of heteronucleus magnetic resonance imaging is much lower than that of hydrogen nucleus magnetic resonance imaging, a large quantity of imaging data needs to be acquired, and a long time is spent in data acquisition. Existing commercial magnetic resonance imaging instruments are generally equipped with only one hydrogen nucleus channel, and it is a great challenge to develop a novel rapid heteronucleus magnetic resonance imaging method. The development of the hyperpolarized inert gas technique provides a solution to the rapid heteronucleus magnetic resonance imaging method. One of the keys to realize the magnetic resonance imaging method based on hyperpolarized inert gases is to develop a novel inert gas nucleus channel.

The present invention provides an inert gas nucleus channel device and a magnetic resonance imaging method, which realize inert gas nucleus magnetic resonance imaging through an external structure by adding the dual-frequency function to a single-frequency hydrogen nucleus system without changing the universal magnetic resonance imaging instrument. The inert gas nucleus channel device mainly comprises an external transmission mixer, radio-frequency power amplifiers, coils, pre-amplifiers and a reception mixer. By making full use of existing unit devices of the single-frequency hydrogen nucleus magnetic resonance imaging spectrometer, the external structure does not include a modulator/demodulator, a reception amplifier or an AD converter. The frequency of excitation pulses and the frequency of echo signals are adjusted through mixing so as to control excitation and reception of an inert gas nucleus coil, and hardware of the universal magnetic resonance spectrometer is improved, thus, realizing rapid magnetic resonance imaging based on hyperpolarized inert gases (such as xenon-129).

SUMMARY OF THE INVENTION

To solve the problem of "black hole" of traditional lung hydrogen nucleus magnetic resonance imaging, the present invention provides an inert gas nucleus channel device and a magnetic resonance imaging method, which use hyperpolarized inert gas (such as xenon-129) as a signal source to decrease the pulse excitation frequency to the Larmor frequency $\omega_X$ of the inert gas nuclei by a mixer and to increase the frequency of received inert gas nucleus echo signals to the Larmor frequency $\omega_H$ of hydrogen nuclei, thereby being capable of directly realizing hyperpolarized inert gas-based magnetic resonance imaging on the commercial magnetic resonance imaging instrument.

The operating process is as follows: a transmission pulse control signal with the hydrogen nucleus resonance frequency as a base frequency is led out from an input terminal of a radio-frequency power amplifier of a universal nuclear magnetic resonance imaging spectrometer, the transmission pulse control signal is firstly down-converted into a transmission pulse control signal with the inert gas xenon-129 nucleus resonance frequency as a base frequency by an external mixer, and then excitation and acquisition of a magnetic resonance signal are achieved by an external radio-frequency power amplifier, a coil and a pre-amplifier, which operate at this frequency. Afterwards, the received signal is up-converted into an envelope signal with the hydrogen nucleus resonance frequency as a base frequency by a reception mixer, and the envelope signal is transmitted to a coil reception port of an original single-frequency magnetic resonance control system. In this way, the single-frequency hydrogen nucleus magnetic resonance control system can excite, receive and process inert gas xenon-129 nucleus magnetic resonance signals without state changes.

To fulfill the above objective, the following technical measure is adopted by the present invention:

An inert gas nucleus channel device comprises a magnetic resonance control system. The magnetic resonance control system is connected to an input terminal of a radio frequency generator. An output terminal of the radio frequency generator is connected to a first input terminal of a first mixer. A second input terminal of the first mixer is connected to an output terminal of a frequency synthesizer. An output terminal of the first mixer is connected to an inert gas nucleus coil through a second power amplifier and a transmission channel of a second T/R switch. The inert gas nucleus coil is connected to a first input terminal of a second mixer sequentially through a reception channel of the second T/R switch and a second pre-amplifier. A second input terminal of the second mixer is connected to an output terminal of the frequency synthesizer. An output terminal of the second mixer is connected to the magnetic resonance control system through a RF amplifier and AD converter. The magnetic resonance control system is connected to the second T/R switch.

A magnetic resonance imaging method comprises the following steps:

The radio frequency generator conducts AD conversion on a sequence pulse output by the magnetic resonance control system to synthesize a standard radio-frequency signal with a hydrogen nucleus Larmor frequency $\omega_H$ as a center frequency;

the frequency synthesizer generates a frequency signal with a center frequency set as a Larmor frequency $\omega_Y$, wherein $\omega_Y = \omega_H - \omega_X$, $\omega_H$ is the hydrogen nucleus Larmor frequency, and $\omega_X$ is an inert gas nucleus Larmor frequency;

the first mixer mixes the standard radio-frequency signal with the hydrogen nucleus Larmor frequency $\omega_H$ as the center frequency and the frequency signal with the center frequency set as the Larmor frequency $\omega_Y$ into a radio-frequency pulse signal with the inert gas nucleus Larmor frequency $\omega_X$ as a center frequency;

the radio-frequency pulse signal with the inert gas nucleus Larmor frequency $\omega_X$ as the center frequency is amplified by the second power amplifier and then transmitted to the inert gas nucleus coil via the transmission channel of the second T/R switch;

the inert gas nucleus coil is driven by the amplified radio-frequency pulse signal with the inert gas nucleus Larmor frequency $\omega_X$ as the center frequency to emit a radio-frequency pulse with a set waveform, pulse width, power and repeat cycle, the radio-frequency pulse couples energy onto a spinning nucleus of a testee to generate a radio-frequency echo signal magnetization intensity $M_X$, and after the radio-frequency pulse is excited, a radio-frequency echo signal is induced from the inert gas nucleus coil according to the radio-frequency echo signal magnetization intensity $M_X$;

the radio-frequency echo signal is input to the second pre-amplifier to be amplified via the reception channel of the second T/R switch;

the amplified radio-frequency echo signal and the radio-frequency signal having the center frequency set as the Larmor frequency wy generated by the frequency synthesizer are mixed by the second mixer, so that a signal increased to the hydrogen nucleus magnetic resonance frequency is obtained;

the signal increased to a hydrogen nucleus magnetic resonance frequency is input to the RF amplifier and AD converter to obtain a digital nuclear magnetic resonance signal; and the digital nuclear magnetic resonance signal is input to the magnetic resonance control system for image reconstruction to obtain an inert gas nucleus magnetic resonance image.

When the amplified radio-frequency pulse signal with the inert gas nucleus Larmor frequency $\omega_X$ as the center frequency is transmitted to the inert gas nucleus coil via the transmission channel of the second T/R switch, the second T/R switch is disconnected to the second pre-amplifier.

When the radio-frequency echo signal is input to the second pre-amplifier to be amplified via the reception channel of the second T/R switch, the second T/R switch is disconnected to the second power amplifier.

Inert gases include xenon, helium, and krypton.

Compared with the prior art, the present invention has the following advantages. The commercial magnetic resonance imaging instrument is simply transformed by adding two sets of frequency conversion devices, thus, realizing excitation and detection of hyperpolarized inert gas nucleus magnetic resonance signals; and the traditional magnetic resonance imaging instrument is upgraded to become a dual-nuclei or multi-nuclei probing magnetic resonance imaging instrument, which can detect hyperpolarized inert gas nuclei and can be freely expanded to magnetic resonance imaging based on other nuclei, thereby having important application value in early clinic diagnosis of possible and potential pulmonary diseases.

Reference numbers in the Figures are used as follows: 1—magnetic resonance control system; 2—radio frequency generator; 3—first power amplifier; 4—first T/R switch; 5—hydrogen nucleus coil; 6—first pre-amplifier; 7—RF amplifier and AD converter; 8—frequency synthesizer; 9—first mixer; 10—second power amplifier; 11—second T/R switch; 12—inert gas nucleus coil; 13—second pre-amplifier; 14—second mixer; 15—main magnetic field; 16—gradient coil; 17—testee.

DETAILED DESCRIPTION OF THE INVENTION

The present invention is further described in detail in combination with FIG. 1 and FIG. 2 as follows, but the present invention is by no means limited to the following embodiments.

Embodiment 1: with the inert gas xenon-129 as an example, a universal 1.5 T magnetic resonance imaging instrument is used.

Figure 1:
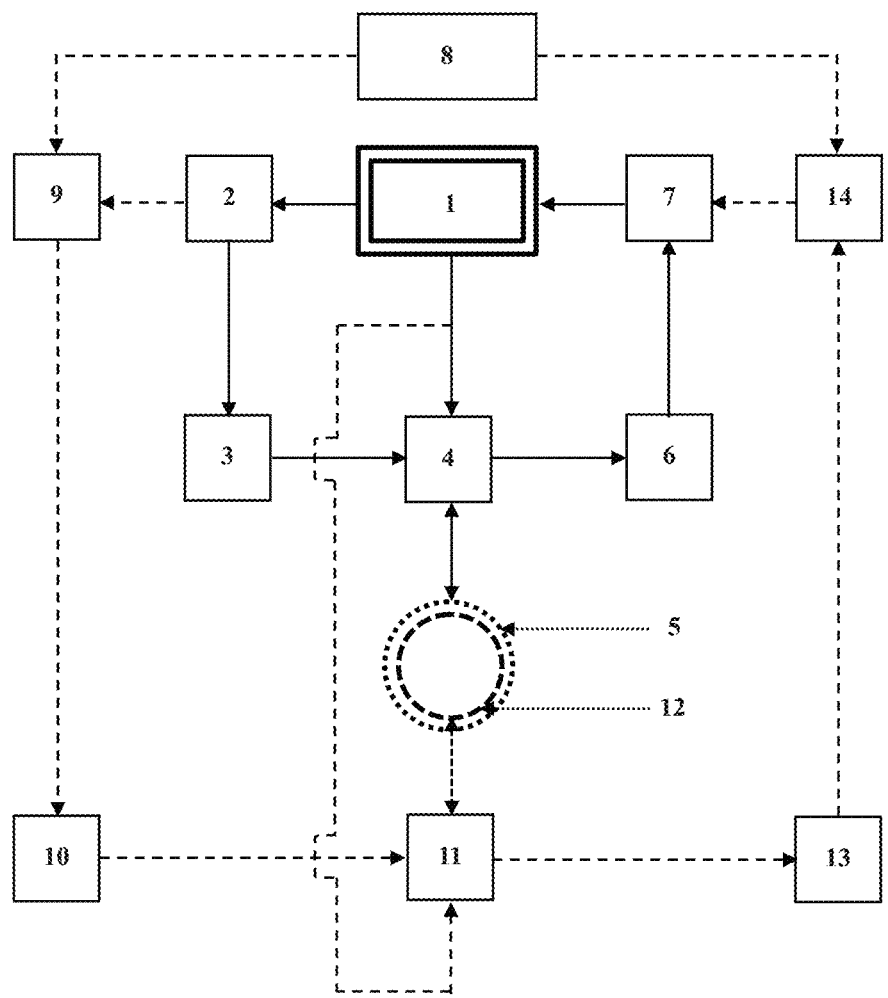
FIG. 1 is a schematic diagram of an inert gas nucleus channel device.
Figure 2:
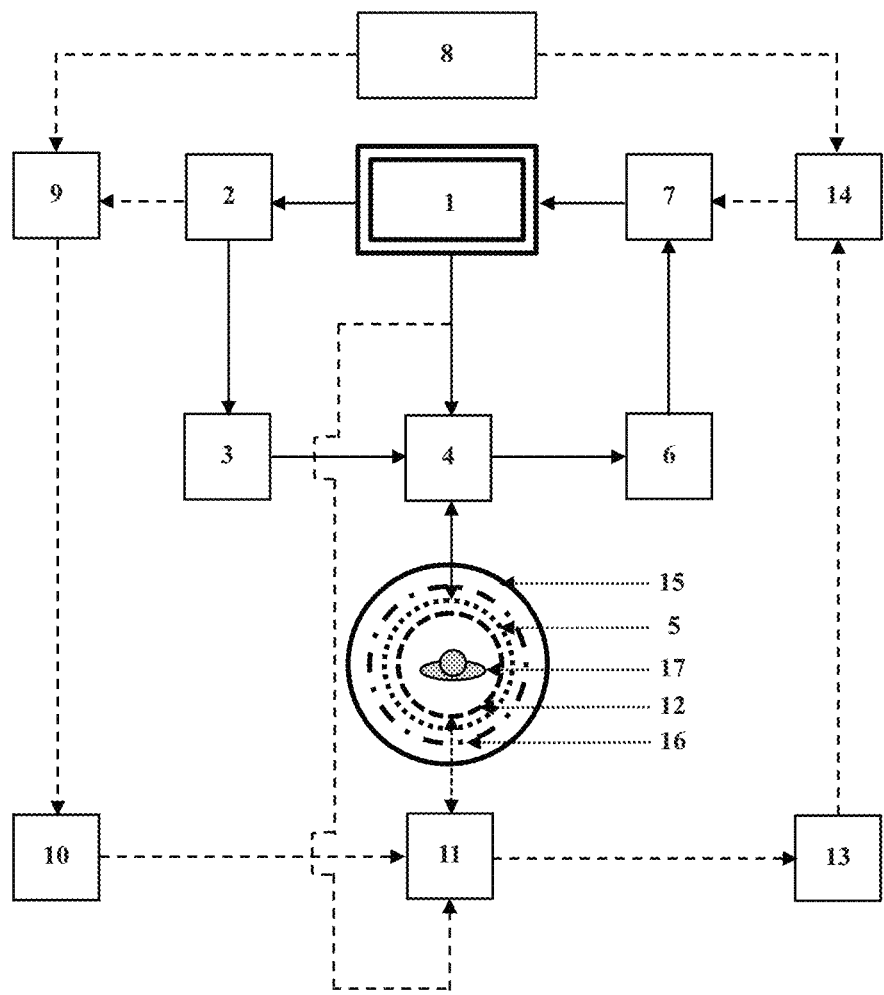
FIG. 2 is an implementation diagram of the inert gas nucleus channel device.

As shown in FIG. 1 and FIG. 2, an inert gas nucleus channel device comprises a magnetic resonance control system 1, a radio frequency generator 2, a first power amplifier 3, a first T/R switch 4, a hydrogen nucleus coil 5, a first pre-amplifier 6, a RF amplifier and AD converter 7, a frequency synthesizer 8, a first mixer 9, a second power amplifier 10, a second T/R switch 11, an inert gas nucleus coil 12, a second pre-amplifier 13 and a second mixer 14.

A hydrogen nucleus channel of the magnetic resonance imaging instrument used for positional imaging comprises a magnetic resonance control system 1, a radio frequency generator 2, a first power amplifier 3, a first T/R switch 4, a hydrogen nucleus coil 5, a first pre-amplifier 6 and a RF amplifier and AD converter 7. One output terminal of the magnetic resonance control system 1 is sequentially connected to the radio frequency generator 2, the first power amplifier 3, the first T/R switch 4, the hydrogen nucleus coil 5, the first pre-amplifier 6 and the RF amplifier and AD converter 7 through a cable (solid line). An output terminal of the RF amplifier and AD converter 7 is connected to the magnetic resonance control system 1. One path (solid line) of the other output terminal of the magnetic resonance control system 1 is sequentially connected to the first T/R switch 4 and the hydrogen nucleus coil 5 through a cable.

An inert gas nucleus channel of the magnetic resonance imaging instrument comprises a magnetic resonance control system 1, a radio frequency generator 2, a frequency synthesizer 8, a first mixer 9, a second power amplifier 10, a second T/R switch 11, an inert gas nucleus coil 12, a second pre-amplifier 13, a second mixer 14 and a RF amplifier and AD converter 7. An output terminal of the frequency synthesizer 8 is connected to an input terminal of the first mixer 9 and an input terminal of the second mixer 14. One terminal of the magnetic resonance control system 1 is sequentially connected to the radio frequency generator 2, the first mixer 9, the second power amplifier 10, the second T/R switch 11, the second pre-amplifier 13, the second mixer 14 and the RF amplifier and AD converter 7 through a cable. The other path of the other terminal of the magnetic resonance control system 1 is sequentially connected to the second T/R switch 11 and the inert gas nucleus coil 12 through a cable.

A positional image of the lungs of a testee 17, namely a hydrogen nucleus magnetic resonance image of the lungs, is acquired firstly. As shown in FIG. 2, the testee 17 is sent to a center area defined by a main magnetic field 15, gradient coils 16 and the hydrogen nucleus coil 5. The main magnetic field 15 generates a 1.5 T magnetic field, and the gradient coils 16 on the X axis, the Y axis and the Z axis are controlled by a pulse program to generate a set imaging gradient magnetic field, which is always kept synchronous with a standard radio-frequency signal, with a center frequency of 63.87 MHz, generated by the radio frequency generator 2. The imaging pulse program is selected at a display terminal of the magnetic resonance control system 1. The radio frequency generator 2 conducts DA conversion on a sequence pulse output by the magnetic resonance control system 1 to synthesize the standard radio-frequency signal with the center frequency of 63.87 MHz (namely a standard radio-frequency signal with a hydrogen nucleus Larmor frequency $\omega_H$ as a center frequency). The standard radio-frequency signal is input to the power amplifier 3 via a cable, and it is necessary to make sure that the amplified radio-frequency signal enters the hydrogen nucleus coil 5 when a radio-frequency pulse is emitted. The first T/R switch 4 is used for switching the operating state of a transmission/reception channel of the hydrogen nucleus coil 5 under the control of the magnetic resonance control system 1. When the hydrogen nucleus coil 5 is in a transmission operating state, the power-amplified standard radio-frequency signal with the center frequency of 63.87 MHz is input to the transmission channel of the first T/R switch 4 via a cable, and under the control of the magnetic resonance control system 1, the power-amplified standard radio-frequency signal with the center frequency of 63.87 MHz is input to the hydrogen nucleus coil 5 via the transmission channel of the first T/R switch 4. The hydrogen nucleus coil 5 has two functions, namely a function of exciting hydrogen nuclei and a function of receiving magnetic resonance signals. The hydrogen nucleus coil 5 transmits a radio-frequency pulse with a set waveform, pulse width, power and repeat cycle to the testee 17, and the radio-frequency pulse couples energy to hydrogen nucleus spins of the testee. After being excited, the radio-frequency pulse with the center frequency of 63.87 MHz induces the magnetization intensity of a radio-frequency echo signal, which is modulated from the magnetic resonance signal in the hydrogen nucleus coil 5 and carries with spatial code information. Due to the fact that the radio-frequency echo signal is just on the microvolt level and is prone to disturbance and attenuation caused by long cables, the magnetic resonance signal received by the hydrogen nucleus coil 5 is primarily amplified by the first pre-amplifier 6. When the hydrogen nucleus coil 5 is in the reception operating state, the radio-frequency echo signal is output to the first pre-amplifier 6 via the reception channel of the first T/R switch 4 under the control of the magnetic resonance control system 1. The magnetic resonance signal primarily amplified by the pre-amplifier is further amplified in the RF amplifier and AD converter 7 and then converted into a digital signal from an analog signal, and the digital signal is sent to a master computer of the magnetic resonance control system 1. The radio-frequency echo signal is amplified first by the low-noise first pre-amplifier 6 and then input to the RF amplifier and AD converter 7 through a wire, and finally, a digital hydrogen nucleus magnetic resonance signal used for positioning is obtained. The digital hydrogen nucleus magnetic resonance signal is only a black outline image of the lungs of the testee 17 and is used for image positioning.

After hydrogen nucleus-based positional imaging is completed, a gasbag filled with a hyperpolarized inert gas xenon-129 is delivered into a magnetic resonance imaging room so as to be inhaled into the lungs by the testee 17, then magnetic resonance imaging based on the hyperpolarized inert gas xenon-129 is applied to the lungs, the testee 17 has to hold the breath for tens of seconds in the imaging process, and thus, a short time is consumed. Spinning nuclei used for hyperpolarized inert gas-based magnetic resonance imaging are hyperpolarized inert gas xenon-129 nuclei. The functions of all the components of the device and the magnetic resonance imaging process based on the hyperpolarized inert gas xenon-129 nuclei of the lungs of the human body are as follows:

the radio-frequency generator 2 conducts DA conversion on a sequence pulse output by the magnetic resonance control system 1 to synthesize a standard radio-frequency signal with a hydrogen nucleus Larmor frequency $\omega_H$ as a center frequency;

the frequency synthesizer 8 generates a frequency signal with a center frequency set as a Larmor frequency $\omega_Y$, wherein $\omega_Y = \omega_H - \omega_X$, $\omega_H$ is the hydrogen nucleus Larmor frequency, and $\omega_X$ is an inert gas nucleus Larmor frequency;

the first mixer 9 mixes the standard radio-frequency signal with the hydrogen nucleus Larmor frequency $\omega_H$ as the center frequency and the frequency signal with the center frequency set as the Larmor frequency $\omega_Y$ into a radio-frequency pulse signal with the inert gas nucleus Larmor frequency $\omega_X$ as a center frequency;

the radio-frequency pulse signal with the inert gas nucleus Larmor frequency $\omega_X$ as the center frequency is amplified by the second power amplifier 10 and then transmitted to the inert gas nucleus coil 12 via the transmission channel of the second T/R switch 11;

the inert gas nucleus coil 12 is driven by the amplified radio-frequency pulse signal with the inert gas nucleus Larmor frequency $\omega_X$ as the center frequency to emit a radio-frequency pulse with a set waveform, pulse width, power and repeat cycle, the radio-frequency pulse couples energy onto a spinning nucleus of the testee to generate a radio-frequency echo signal magnetization intensity $M_X$, and after the radio-frequency pulse is excited, a radio-frequency echo signal is induced from the inert gas nucleus coil 12 based on the radio-frequency echo signal magnetization intensity $M_X$;

the radio-frequency echo signal is input to the second pre-amplifier 13 to be amplified via the reception channel of the second T/R switch 11;

the amplified radio-frequency echo signal and the radio-frequency signal, with the center frequency set as the Larmor frequency $\omega_Y$, generated by the frequency synthesizer 8 are mixed by the second mixer 14, so that a signal increased to a hydrogen nucleus magnetic resonance frequency is obtained;

the signal increased to the hydrogen nucleus magnetic resonance frequency is input to the RF amplifier and AD converter 7 to obtain a digital nuclear magnetic resonance signal; and the digital nuclear magnetic resonance signal is input to the magnetic resonance control system 1 for image reconstruction to obtain an inert gas xenon-129 nucleus magnetic resonance image.

When the amplified radio-frequency pulse signal with the inert gas nucleus Larmor frequency $\omega_X$ as the center frequency is transmitted to the inert gas nucleus coil 12 via the transmission channel of the second T/R switch 11, the second T/R switch 11 is disconnected to the second pre-amplifier 13.

When the radio-frequency echo signal is input to the second pre-amplifier 13 to be amplified via the reception channel of the second T/R switch 11, the second T/R switch 11 is disconnected to the second power amplifier 10.

Wherein:

a) The magnetic resonance control system 1 comprises a master computer and a front controller and is used for output control of the sequence pulse and image construction of the received digital nuclear magnetic resonance signal. The sequence pulse can be selected at a display terminal of the master computer of the magnetic resonance control system 1. One terminal of the magnetic resonance control system 1 is connected to the radio frequency generator 2 through a cable.

b) The radio frequency generator 2 is used for conducting DA conversion on the sequence pulse output by the master computer of the magnetic resonance control system 1 to synthesize a radio-frequency pulse signal with a hydrogen nucleus magnetic resonance frequency as a carrier frequency. A high-stability radio frequency generator 2 can generate a standard radio-frequency signal with a center frequency of 63.87 MHz (namely a standard radio-frequency signal with a hydrogen nucleus Larmor frequency $\omega_H$ as a center frequency).

c) The frequency synthesizer 8 is a high-stability and frequency-adjustable standard signal source and provides a base frequency for exciting a radio-frequency pulse on a certain level. The frequency synthesizer 8 generates a frequency signal with a reference frequency of 52.09 MHz (namely a frequency signal with a center frequency set as a Larmor frequency (reference frequency) $\omega_Y$, wherein $\omega_Y = \omega_H - \omega_X$, $\omega_H$ is the hydrogen nucleus Larmor frequency, and $\omega_X$ is an inert gas nucleus Larmor frequency), and the frequency signal with the reference frequency of 52.09 MHz is to be mixed with the standard radio-frequency signal with the center frequency of 63.87 MHz.

d) The first mixer 9 is used for converting the radio-frequency signal with the hydrogen nucleus magnetic resonance frequency as the carrier frequency into a radio-frequency pulse signal with the inert gas nucleus magnetic resonance frequency as a carrier frequency, namely for outputting a radio-frequency pulse signal with the inert gas nucleus Larmor frequency $\omega_X$ as the center frequency. The first mixer 9 has two input ports respectively connected to the hydrogen nucleus radio frequency generator 2 and the frequency synthesizer 8 through cables and outputs the filtered radio-frequency signal to the second power amplifier 10 through an output port. The 63.87 MHz standard signal source generated by the radio frequency generator 2 and the 52.09 MHz frequency signal generated by the frequency synthesizer 8 are mixed in the first mixer 9 to achieve frequency decrease, so that an inert gas xenon-129 nucleus magnetic resonance radio-frequency signal with a frequency of 11.78 MHz is generated.

e) The second power amplifier 10 operates at the inert gas nucleus magnetic resonance frequency and amplifies the inert gas xenon-129 nucleus magnetic resonance radio-frequency signal output by the first mixer 9 to drive the inert gas nucleus coil 12. The inert gas xenon-129 nucleus magnetic resonance radio-frequency signal is input to the second power amplifier 10 through a cable so as to be amplified, and each stage of cell of the second power amplifier 10 is composed of a transistor, a field-effect tube, an integrated circuit and the like.

f) The second T/R switch 11 is provided with four ports respectively connected to a reception and transmission control signal generated by the magnetic resonance control system 1, the second power amplifier 10, the inert gas nucleus coil 12 and the second pre-amplifier 13. In work, the second T/R switch 11 switches the transmission/reception operating state of the inert gas nucleus coil 12 under the control of the magnetic resonance control system 1. When the inert gas nucleus coil 12 is in the transmission operating state, the power-amplified inert gas xenon-129 nucleus magnetic resonance radio-frequency signal enters the inert gas nucleus coil 12 via the transmission channel of the second T/R switch 11, and the second pre-amplifier 13 is disconnected for protection. The inert gas nucleus coil 12 emits a radio-frequency pulse with a set waveform, pulse width, power and repeat cycle, and the radio-frequency pulse couples energy to inert gas xenon-129 spins of the testee 17. When the inert gas nucleus coil 12 is in the reception operating state, the reception channel of the second T/R switch 11 is communicated with the inert gas nucleus coil 12 and the second pre-amplifier 13, and the second power amplifier 10 is disconnected for noise reduction.

g) The inert gas nucleus coil 12 resonates at the magnetic resonance frequency and is used for exciting and receiving the inert gas nucleus magnetic resonance signal. Under the excitation of the power-amplified inert gas xenon-129 nucleus magnetic resonance radio-frequency signal, an inert gas xenon-129 nucleus magnetic resonance radio-frequency echo signal carrying with spatial code information and having a frequency of 11.78 MHz is induced in the inert gas nucleus coil 12.

h) The second pre-amplifier 13 primarily amplifies the inert gas xenon-129 nucleus magnetic resonance radio-frequency echo signal received by the inert gas nucleus coil 12. As the inert gas xenon-129 nucleus magnetic resonance radio-frequency echo signal received by the inert gas nucleus coil 12 is only on the microvolt level and cannot stand disturbance and attenuation caused by long cables, the signal needs be amplified first by the low-noise second pre-amplifier 13.

i) The second mixer 14 has a frequency conversion effect opposite to that of the first mixer 9 and is used for converting the inert gas xenon-129 nucleus magnetic resonance radio-frequency echo signal into a radio-frequency signal with the hydrogen nucleus magnetic resonance frequency as the carrier frequency and then sending the radio-frequency signal to the RF amplifier and AD converter 7 for amplification. The amplified inert gas xenon-129 nucleus magnetic resonance radio-frequency echo signal is mixed with the signal, with the reference frequency of 52.09 MHz, generated by the frequency synthesizer 8 in the second mixer 14 to achieve frequency increase, so that a hydrogen nucleus magnetic resonance signal increased to 63.87 MHz is obtained.

j) The signal increased to the hydrogen nucleus resonance signal of 63.87 MHz is input to the RF amplifier and AD converter 7 through a cable, and finally, a digital magnetic resonance signal is obtained.

k) The digital magnetic resonance signal is input to the magnetic resonance control system 1 to conduct data processing and image reconstruction, image data are sent to the display terminal to achieve image reconstruction based on the corresponding inert gas xenon-129 nucleus magnetic resonance radio-frequency echo signal, and a reconstructed high-quality inert gas xenon-129 nucleus magnetic resonance image is displayed on the computer terminal. The specific embodiments in the specification are only used for illustrating the spirit of the present invention. Without deviating from the spirit of the present invention or beyond the scope defined by the claims, various modifications, supplementations or similar substitutes of these specific embodiments can be made by those skilled in this field.

We claim:

1. A device having an inert gas nucleus channel, comprising:
   a magnetic resonance control system,
   a radio frequency generator having an input terminal and an output terminal,
   a first mixer having a first input terminal, a second input terminal, and an output terminal,
   a frequency synthesizer having an output terminal,
   an inert gas nucleus coil,
   a second power amplifier,
   a second T/R switch having a transmission channel and a reception channel,
   a second mixer having a first input terminal, a second input terminal, and an output terminal,
   a second pre-amplifier, and
   an RF amplifier and AD converter,
   wherein the magnetic resonance control system is connected to the input terminal of the radio frequency generator,
   the output terminal of the radio frequency generator is connected to the first input terminal of the first mixer,
   the second input terminal of the first mixer is connected to the output terminal of the frequency synthesizer,
   the output terminal of the first mixer is connected to the inert gas nucleus coil through the second power amplifier and the transmission channel of the second T/R switch,
   the inert gas nucleus coil is connected to the first input terminal of the second mixer sequentially through the reception channel of the second T/R switch and the second pre-amplifier,
   the second input terminal of the second mixer is connected to the output terminal of the frequency synthesizer,
   the output terminal of the second mixer is connected to the magnetic resonance control system through the RF amplifier and AD converter, and
   the magnetic resonance control system is connected to the second T/R switch.

2. A method for magnetic resonance imaging using the device of claim 1, comprising:
   conducting by the radio frequency generator a DA conversion on a sequence pulse output by the magnetic resonance control system to synthesize a standard radio-frequency signal with a hydrogen nucleus Larmor frequency $\omega_H$ as a center frequency;

generating by the frequency synthesizer a frequency signal with a center frequency set as a Larmor frequency $\omega_Y$, wherein $\omega_Y = \omega_H - \omega_X$, $\omega_H$ is the hydrogen nucleus Larmor frequency, and $\omega_X$ is an inert gas nucleus Larmor frequency for an inert gas being used;

mixing by the first mixer the standard radio-frequency signal with the hydrogen nucleus Larmor frequency $\omega_H$ as the center frequency and the frequency signal with the center frequency set as the Larmor frequency $\omega_Y$ into a radio-frequency pulse signal with the inert gas nucleus Larmor frequency $\omega_X$ as a center frequency;

amplifying by the second power amplifier the radio-frequency pulse signal with the inert gas nucleus Larmor frequency $\omega_X$ as the center frequency and then transmitting the amplified radio-frequency pulse signal to the inert gas nucleus coil via the transmission channel of the second T/R switch;

emitting a radio-frequency pulse with a set waveform, pulse width, power and repeat cycle by the inert gas nucleus coil driven by the amplified radio-frequency pulse signal with the inert gas nucleus Larmor frequency $\omega_X$ as the center frequency, coupling energy onto a spinning nucleus of a testee by the radio-frequency pulse to generate a radio-frequency echo signal magnetization intensity $M_X$, and after the radio-frequency pulse is excited, inducing a radio-frequency echo signal from the inert gas nucleus coil based on the radio-frequency echo signal magnetization intensity $M_X$;

inputting the radio-frequency echo signal to the second pre-amplifier via the reception channel of the second T/R switch and amplifying the radio-frequency echo signal by the second pre-amplifier;

mixing by the second mixer the amplified radio-frequency echo signal and the radio-frequency signal, with the center frequency set as the Larmor frequency wy and generated by the frequency synthesizer, to obtain a signal increased to a hydrogen nucleus magnetic resonance frequency;

inputting the signal increased to the hydrogen nucleus magnetic resonance frequency to the RF amplifier and AD converter to obtain a digital nuclear magnetic resonance signal; and inputting the digital nuclear magnetic resonance signal to the magnetic resonance control system for image reconstruction to obtain an inert gas nucleus magnetic resonance image.

3. The method for magnetic resonance imaging according to claim 2, wherein when the amplified radio-frequency pulse signal with the inert gas nucleus Larmor frequency $\omega_X$ as the center frequency is transmitted to the inert gas nucleus coil via the transmission channel of the second T/R switch, the second T/R switch is disconnected from the second pre-amplifier.

4. The method for magnetic resonance imaging according to claim 2, wherein when the radio-frequency echo signal is input to the second pre-amplifier to be amplified via the reception channel of the second T/R switch, the second T/R switch is disconnected from the second power amplifier.

5. The method for magnetic resonance imaging according to claim 2, wherein the inert gas is xenon, helium, or krypton.

* * * * *